United States Patent [19]

Liu

[11] Patent Number: 5,736,863
[45] Date of Patent: Apr. 7, 1998

[54] ABATEMENT OF ELECTRON BEAM CHARGING DISTORTION DURING DIMENSIONAL MEASUREMENTS OF INTEGRATED CIRCUIT PATTERNS WITH SCANNING ELECTRON MICROSCOPY BY THE UTILIZATION OF SPECIALLY DESIGNED TEST STRUCTURES

[75] Inventor: Chwen-Ming Liu, Chaiyi, Taiwan

[73] Assignee: Taiwan Semiconductor Manufacturing Company, Ltd., Hsin-chu, Taiwan

[21] Appl. No.: 666,161

[22] Filed: Jun. 19, 1996

[51] Int. Cl.$^6$ ................... H01L 23/58; G01R 31/26
[52] U.S. Cl. ................. 324/765; 324/719; 324/768; 324/769; 257/48
[58] Field of Search ................. 324/765–769, 324/719; 257/48

[56] References Cited

U.S. PATENT DOCUMENTS

| | | | |
|---|---|---|---|
| 3,798,513 | 3/1974 | Ono | 257/372 |
| 4,143,391 | 3/1979 | Suzuki | 257/372 |
| 4,265,935 | 5/1981 | Hall | 257/758 |
| 4,778,771 | 10/1988 | Hiki | 324/765 |
| 4,933,743 | 6/1990 | Thomas | 257/758 |
| 5,159,752 | 11/1992 | Mahant-shetti et al. | 29/846 |
| 5,384,268 | 1/1995 | Lur et al. | 437/20 |
| 5,460,034 | 10/1995 | Herrick | 73/105 |

Primary Examiner—Jerome Jackson
Attorney, Agent, or Firm—George O. Saile; Stephen B. Ackerman

[57] ABSTRACT

The inspection and measurement of critical dimensions of patterned features during the manufacture of sub-micron integrated circuits relies heavily upon the scanning-electron-microscope(SEM). This instrument is capable of quick, clean, and accurate measurements of features on large in-process silicon wafers. However, such features are frequently isolated from the electrical ground of the microscope by virtue of their circuit design. This creates a charge build up from the electron beam in the SEM and causes distorted and indistinct images, incapable of being measured. Also, such static charge build-up can be destructive to certain circuit elements. This invention teaches the use of independent inspection test structures, fabricated in wafer saw kerf regions or within designated test sites, especially designed to provide a reduction or elimination of charge build up during SEM observation. The structures are built to follow conventional processing and carry the desired features to be examined at each successive process level. They are particularly useful for examining and measuring contact and via openings, and measuring interconnection metal line widths and spacings, including polysilicon structures.

10 Claims, 6 Drawing Sheets

ABATEMENT OF ELECTRON BEAM CHARGING DISTORTION DURING DIMENSIONAL MEASUREMENTS OF INTEGRATED CIRCUIT PATTERNS WITH SCANNING ELECTRON MICROSCOPY BY THE UTILIZATION OF SPECIALLY DESIGNED TEST STRUCTURES

BACKGROUND OF THE INVENTION (1) Field of the Invention

This invention relates to monitoring and diagnostics of line processes used for the manufacture of semiconductor devices and more particularly to the measurement of critical dimensions of patterns by scanning electron microscopy.

(2) Description of prior art

Integrated circuits are manufactured by first forming discrete semiconductor devices within the surface of silicon wafers. A multi-level metallurgical interconnection network is then formed over the devices contacting their active elements and wiring them together to create the desired circuits. The wiring layers are formed by first depositing an insulating layer over the discrete devices, patterning and etching contact openings into this layer, and then depositing conductive material into these openings. A conductive layer is then applied over the insulating layer which is then patterned and etched to form wiring interconnections between the device contacts thereby creating a first level of basic circuitry. These circuits are then further interconnected by utilizing a second wiring level laid out upon a second insulating layer with via openings to the first level.

Depending upon the complexity of the overall integrated circuit, two to four levels of metallurgy are typically required to form the necessary interconnections and to direct the wiring to pads which make the external connections for the completed chip. Patterning of the contact and wiring levels is accomplished by photolithographic masking techniques accompanied by reactive-ion-etching(RIE).

A high density of circuit elements designed to sub-micron dimensions requires extremely tight dimensional control. Slight variations in processing conditions can generate significant dimensional deviations of the patterned features. To this end highly sensitive inspection methods are required to assure the dimensional and structural integrity of the design patterns.

The scanning electron microscope(SEM) has become a most valuable tool for examining and measuring patterns of sub-micron dimensions. Optical microscopy, even with the finest available microscopes, cannot resolve these images with sufficient accuracy to permit reliable measurements. Many times the objects can be discerned, but measurements to the accuracies required are not possible. The SEM permits such precise measurements to a remarkable degree and, as such, has become a vital tool for monitoring all facets of integrated circuit device manufacturing. In addition, other processing defects, such as small pockets of debris in via or contact openings, could go undetected by optical microscopy. In the SEM, however, they are revealed with extraordinary crispness and clarity.

The principle of the SEM requires placement of the specimen into a vacuum chamber where a focused electron beam impinges on the area being observed. The surface region of the specimen where the inspection is made must be electrically grounded within the SEM. Otherwise electrons from the beam accumulate on the surface and cause severe distortions of the image. Earlier SEMs with smaller chambers could only accept small specimens which were usually mounted onto aluminum pedestals using a conductive silver paste providing a good ground contact. Nevertheless, when the specimens have exposed layers of insulating films such as silicon dioxide or photoresist, local charging of these surfaces occurs, particularly when high beam accelerating voltages are required to obtain sufficient resolution. The result is image distortion sometimes even to the point of obliteration. The problem is avoided on disposable specimens by sputtering a thin layer of gold onto the specimen just prior to insertion into the microscope. This provides a conductive discharge path for the electrons. Herrick et. al U.S. Pat. No. 5,460,034 when examining epitaxial layers of AlGaAs/GaAs, found that a layer of gold 100 Angstroms thick improved their resolution from about 100 Angstroms to 60 Angstroms, by reducing charge build-up.

Current technology permits larger specimens to be placed into the SEM. Whole wafers taken from a production job may now be examined with the SEM and then re-inserted into the production line for continued processing. The SEM is used to examine photoresist images to determine if the feature dimensions are within specifications or if any residue or debris has remained in the developed pattern. The etched patterns in the structural layers are likewise inspected. The ability to insert whole wafers into the SEM for routine examination and measurement with minimal wafer handling risk makes this instrument ideal for production line inspections. However, depositing gold or some other conductive material to alleviate the charging problem is no longer an acceptable option. Since a conductive coating cannot be applied, other means must be taken to provide suitable discharge paths for the electron beam where such a problem exists.

The established features which need dimensional inspection include contact openings, via openings, polysilicon line widths, and metal line widths. Not only must these features be capable of measurement to high resolution but their edges must also verified to be of proper contour. To this end an SEM inspection is useful in establishing the thoroughness of certain processing steps viz. whether an etching operation has fully performed its objective, whether it has left remnants of un-etched material, or whether it has exceeded its objective by invading subjacent material. The accomplishment of these objectives is frequently impaired by electron charging when the feature area cannot provide an adequate discharge path.

It is frequently impossible to accurately inspect and measure pattern features in integrated circuit product dice with the SEM, especially at high resolution, because of the presence of p-n junctions and insulating layers. These barriers obstruct adequate conductive paths for the electrons to the substrate ground and result in image distortions due to charging. In addition, charge build-up in certain device areas such as field-effect-transistor gates, can cause damage to thin underlying gate oxides.

Figure 1:
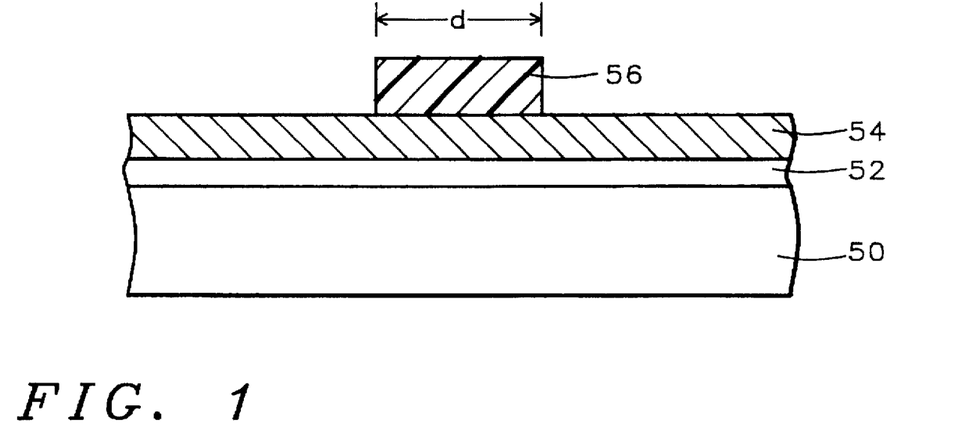
FIG. 1 is a cross section of a photoresist stripe on a polysilicon layer.
Figure 2A:
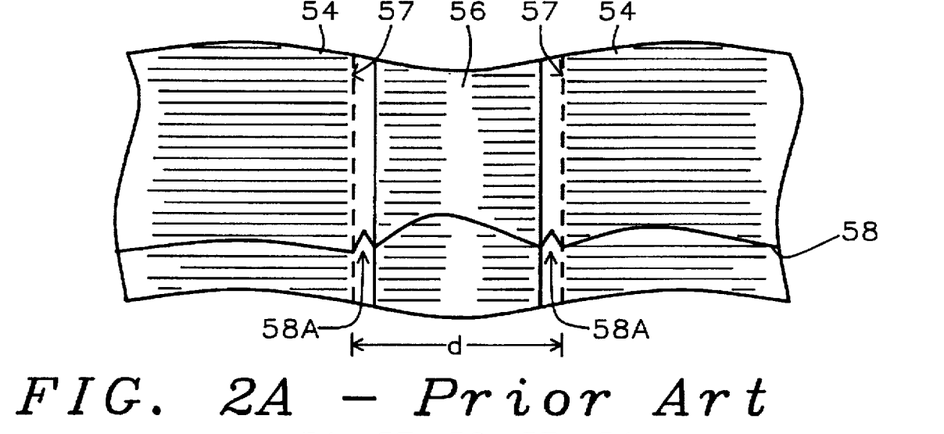
FIG. 2A is a representation of an SEM photograph of the photoresist stripe of FIG. 1 in the absence of surface charging.
Figure 2B:
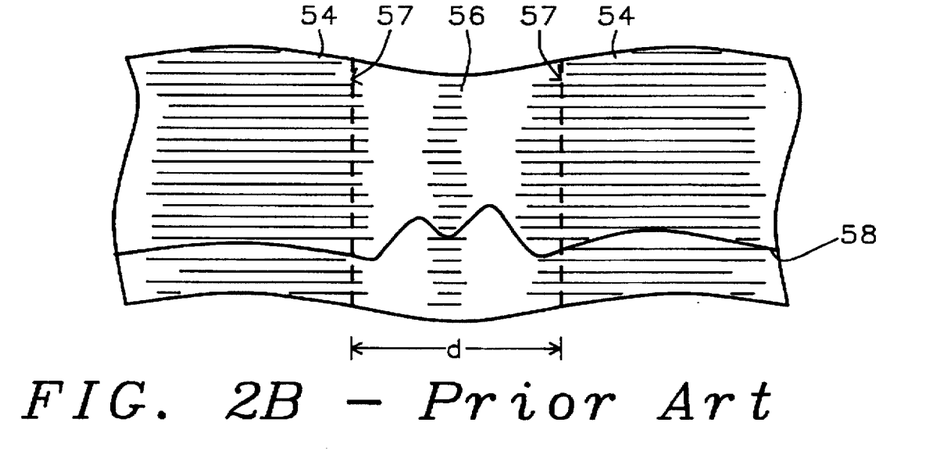
FIG. 2B is a representation of an SEM photograph of the photoresist stripe of FIG. 1 in the presence of severe surface charging.

The effects of electron charging on the inspection and measurement of patterns with an SEM are illustrated by FIGS. 1 and 2. In FIG. 1 there is shown a cross section of a wafer 50 having a layer of silicon oxide 52 and a layer of polysilicon 54. A layer of photoresist has been patterned over the polysilicon layer 54 to form a stripe 56 of width -d-. Such configurations are commonly encountered in the manufacture of integrated circuits. Not only is the SEM called upon to measure the line-width -d- to an accuracy of the order of tenths of a micron, but the integrity of the edge profile must also be established. FIG. 2A shows an SEM image of the photoresist line 56 in the absence of image charging, as would be observed when proper discharge paths are provided. The shading lines represent the darkness of the image. The edges of the photoresist stripe 56 are clearly discernible and the dotted lines 57 are the measurement reticles brought into alignment with the bottom edges of the stripe 56. The spacing -d- between these lines is well defined. Superimposed over the image is a secondary electron intensity scan 58, also provided by the SEM. This signal shows sharp peaks 58A which characterize the edges of the photoresist stripe 56.

In FIG. 2B there is shown the same feature as in FIG. 1 except that now severe image charging has occurred within the SEM. The reticle lines 57 are placed over this image to show the approximate locations of the edges of stripe 56 corresponding to the width -d-. The darker portions of the image now protrude inward, past these lines and only gradually lighten towards the center of the stripe 56. The edge defining peaks 58A of the secondary electron scan 58 are entirely absent. Images of the type shown in FIG. 2A are useless for pattern inspection and measurement purposes.

This invention teaches the use of independent and specially designed test structures having patterns corresponding to features of the integrated circuit dice and provided with conductive paths to drain away the electrons from the SEM electron beam.

Independent test structures for the observation of open circuits and short circuits caused by defects using an SEM have been described by Mahant-Shetti et. al. U.S. Pat. No. 5,159,752. The patterns used by these authors to observe shorts consist of multiple small metal islands enclosed within the squares of a large metal grid structure and separated from the grid by dimensions comparable to those found in integrated circuit metal patterns. An island shorted to the grid by a defect produces a different intensity of secondary electrons and consequently a different shade in the SEM view. The structure for opens utilizes the same pattern but with a connecting stripe between the island and the grid metal. An open stripe caused by a defect results in a different shading of the island compared to the others.

An additional advantage of using independent test structures for SEM inspections rather than subjecting product structures to the SEM beam is that charge sensitive structures such as field-effect-transistor gates are not subjected to the risk of gate oxide damage. Lur et.al. U.S. Pat. No. 5,384,268 have dealt with such charging as it occurs during high energy ion implantation. Here a thin conductive layer of titanium is applied over the structures prior to the implant and removed by dry etching or wet chemical etching afterwards. Clearly, this would not be a practical solution for the frequent SEM inspections required during the interconnection level processing.

SUMMARY OF THE INVENTION

It is an object of this invention to describe specially designed test structures containing pattern features to be inspected by an SEM. The test structures are provided with ground paths or other means by which image distortion from electron charging within the SEM is avoided or significantly reduced. Semiconductor junctions and insulation layers which impede the discharge in the product circuitry are avoided in the design of the test structures. The layout of each test structure is dependent upon the location of the pattern which it represents within the interconnection level hierarchy of the integrated circuit. In two embodiments, direct ground paths to the silicon wafer substrate are provided. In another embodiment additional area is connected to the feature in order to spread the accumulated charge over a larger area. The test structures are applicable only to features which contain conductive elements. The test structures may be formed within the wafer kerf regions or within dedicated manufacturing test sites.

It is a further object of this invention to describe the design of test structures to be used for SEM inspection of the integrity of contact openings by determining if they have been properly opened by a contact etch process.

DESCRIPTION OF THE PREFERRED EMBODIMENTS

Accordingly, in the embodiments of this invention, a p-type <100> oriented silicon substrate(wafer) is provided. The embodiments use, as an example, an integrated circuit process for the manufacture of CMOS devices. It is to be understood that the application of this invention is not confined to CMOS integrated circuits but could be applied to any semiconductor fabrication process.

Figure 3:
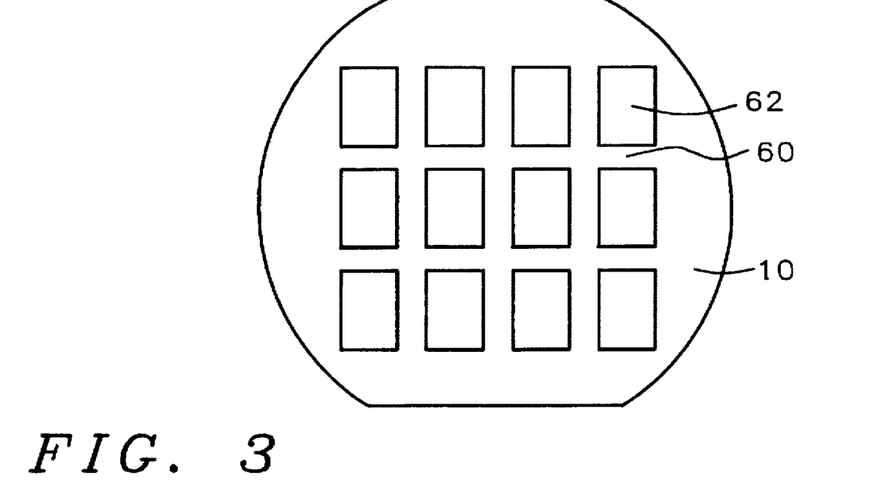
FIG. 3 is a top view of a silicon wafer showing an example layout of integrated circuit dice with kerf areas available for test structures.

Referring to FIG. 3, semiconductor devices are formed within the surface of a silicon wafer 10 in a pattern consisting of an array of rectangular integrated circuit dice 62. Test structures of various kinds are simultaneously formed in the narrow regions 60 between the dice 62 which comprise the kerf area. This is the region that will be consumed by a saw cut which separates the dice at the completion of processing. Among these test structures are those designed for inspection of dimensional and structural integrity with an SEM. In the first and second embodiments there will be discussed, those structures which have direct conductive paths to the silicon substrate ground for the purpose of draining away charge from the electron beam.

The conductive path for the first embodiment passes through a conventional metal contact while in the second embodiment, a polysilicon buried contact is employed. A third embodiment incorporates the use of pseudo-grounded discharge paths formed by means of large area conductive attachments to the conductive regions to be inspected. These attachments provide a means to spread out the charge while the inspection takes place and thereby lowering the charge in the region of interest. The fourth and fifth embodiments address the inspection of contact openings.

After the wafer has undergone all processing steps preceding and including the growth of gate oxide, the processing of the inspection test sites within the kerf area is begun. Thus field oxide isolation regions and other ion implants or diffusions as, for example, n-wells or p-wells are in place. The photomask set must have been designed to mask the growth of isolation oxide and any implants or diffusions within the kerf area allotted for the test structures except for an implant which reinforces the conductivity type of the substrate material.

Figure 4A:
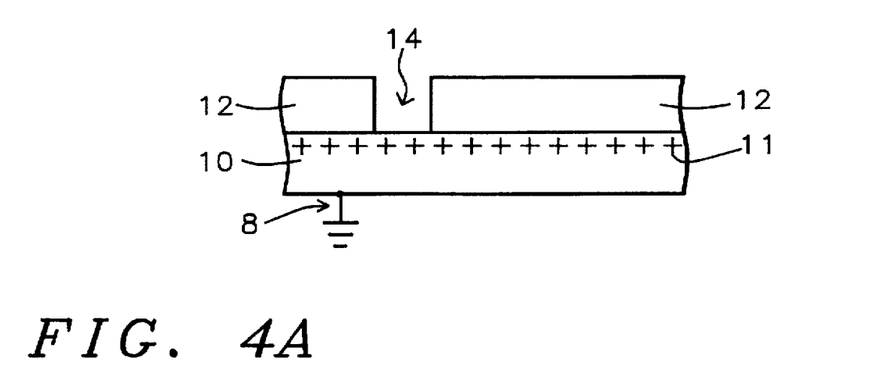
FIG. 4A, B and FIG. 5A, B are cross sections of test structures designed for SEM observation.

The first embodiment, shown in cross section in FIG. 4A, is a contact opening which, in the integrated circuit, would be insulated from substrate ground by a p-n junction. Designed as a special structure for SEM inspection without a subjacent p-n junction, the base of the contact opening 14 in the interlevel-dielectric(ILD) layer 12 forms an unhampered conductive path to the SEM ground 8 via the substrate 10. A boron implant 11 in the test structure reinforces the surface conductivity of the silicon at the contact assuring the absence of carrier depletion at the silicon interface. The surface of the ILD layer 12 can accumulate some surface charge, especially if the SEM is operated at high potentials to achieve high resolution or if the inspection time is too long. With judicious procedure, this charging can be moderated sufficiently to allow ample contour inspection. The elimination of charging in the base of the contact 14 by eliminating the p-n junction reveals pits and debris which would otherwise be obscured.

Figure 4B:
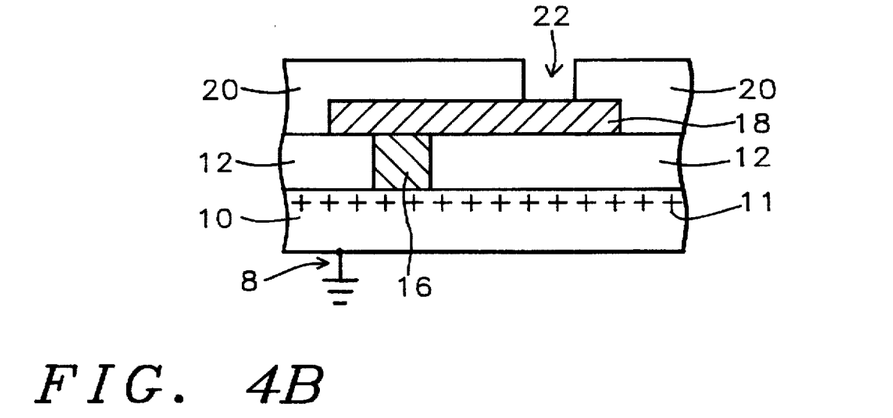

After SEM inspection, the test structure shown in FIG. 4A is processed further and used as the inspection structure for the next level opening which in this embodiment is a via opening shown in FIG. 4B. The contact opening is filled with conductive material 16 such as is used for tungsten plug metallurgy and a patterned layer of first metal 18 is formed over the ILD layer. SEM inspection and measurement of the metal pattern features are then performed. Again, the discharge path provided by the test structure permits inspection and measurement without image distortion due to charging. The pattern dimensions incorporated into the metal 18 in the test structure are representative of those found in the accompanying integrated circuit.

The via opening 22 is etched into the insulating layer 20 at which point SEM inspection is again performed to verify dimensional and structural compliance of the via opening. The electron discharge path of the contact opening 14 is now extended to the via opening 22 through the contact 16 and first metal layer 18. Further extension of this grounding concept to via openings and metal patterns in higher levels of metallization should now be apparent. An advantage of this scheme is that each successive level of inspection can focus on the same structures thereby minimizing the number of required inspection sites required.

Figure 5A:
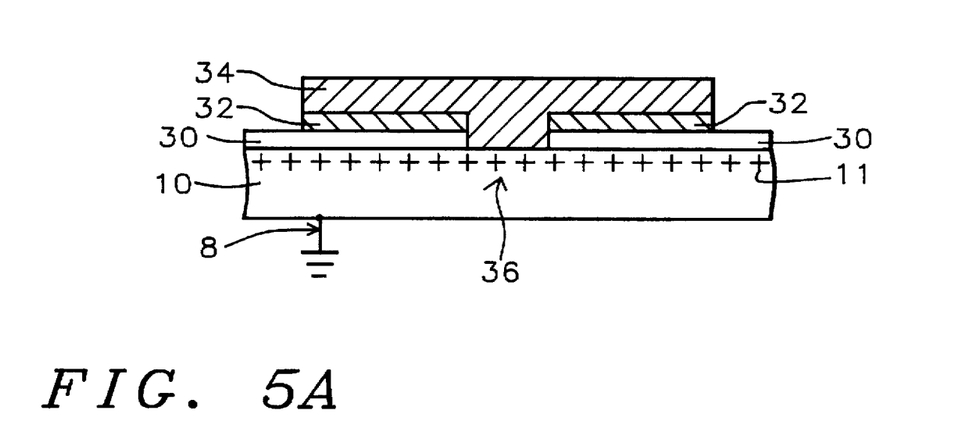
Figure 5B:
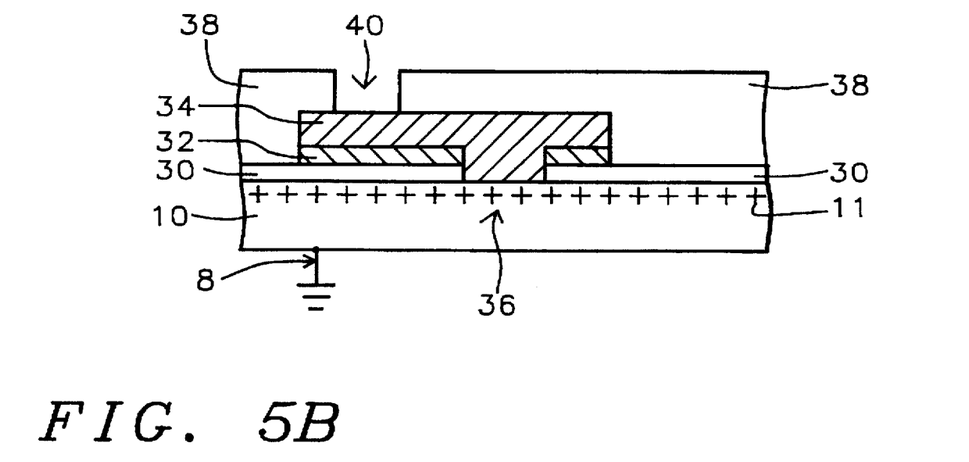

A second embodiment of this invention is shown in FIGS. 5A and 5B. As in the first embodiment a p-type <100> oriented silicon substrate is provided. The embodiment uses as an example, an integrated circuit process for the manufacture of CMOS devices. Semiconductor devices are formed within the surface of the silicon wafer in a pattern consisting of an array of rectangular integrated circuit dice. Test structures are formed in the narrow regions 60 between the dice 62 which comprises the kerf area(FIG. 3).

Referring to FIG. 5A, there is shown a substrate 10 grounded to the SEM by a connection 8. The inspection test site contains no p-n junctions and the surface conductivity is reinforced by an implanted layer 11. A buried contact opening 36 is formed within the gate oxide layer 30. Typically, when buried contacts are used, the gate oxide over the device area is first covered by a thin layer of polysilicon 32 and the buried contact opening 36 is then formed by etching through both layer 32 and the gate oxide 30 as shown in the figure.

At this point the critical dimensions and the integrity of the buried contact opening 36 are validated by SEM inspection. Electrons from the beam are discharged during the inspection by the conductive path through the wafer 10 to the ground 8 permitting a crisp and undistorted image. A polysilicon layer 34 is next deposited and patterned over the buried contact. The polysilicon gates and buried contact conductors in the integrated circuit dice are subsequently patterned in this layer and the subjacent layer 32. The test structure pattern 34 contains polysilicon lines whose widths correspond to those found in the product dice.

Figure 5C:
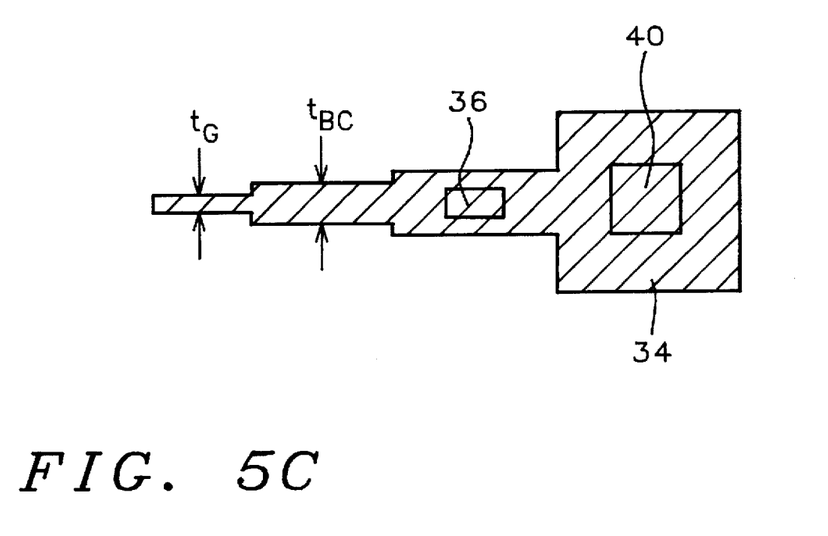
FIG. 5C is a top view of a structure depicting the second embodiment of this invention.

FIG. 5C shows an example of the top view of the polysilicon pattern 34. The SEM inspections of this pattern permits measurements of line widths corresponding to gates $t_G$ and buried contact stripes $t_{BC}$. Referring also to FIG. 5B, further processing of these test structures wherein an insulator 38 with a via opening 40 has been formed, now permits SEM inspection and measurement of this via opening 40 with the benefit of a conductive path to ground through the buried contact 36. This via might, for example, represent the contact of a load resistor formed in a second polysilicon layer to a gate electrode formed in a first polysilicon layer. Such a configuration can be found in poly-load SRAM cells. The top view of the test structure in FIG. 5C shows this via opening 40 as well as the location of the buried contact 36. As in the first embodiment the conductive path provided in the second embodiment may be propagated through higher levels of metallization for other SEM inspections.

Figure 6:
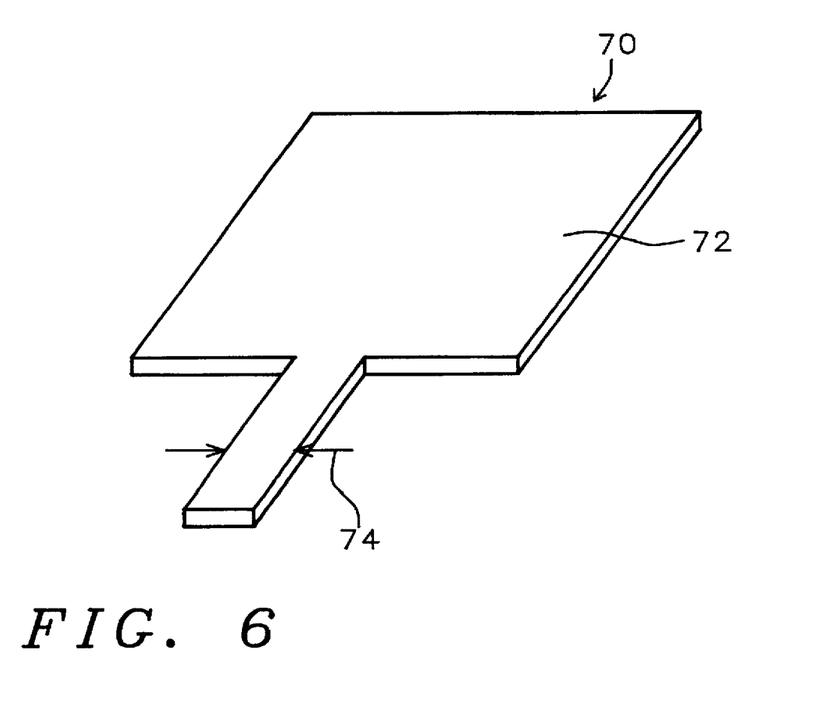
FIG. 6 is a view of a structure depicting the third embodiment of this invention.

A third embodiment of this invention consists of a metal test pattern lying over an insulated surface wherein the portion to be inspected for dimensional compliance is attached to a larger region of metal as shown in FIG. 6. The conductive structure 70 contains a portion 74 which has the dimensions of corresponding features in the product dice which is attached to a large area of conductor 72. The presence of the area 72 permits the spreading out of the SEM charge build-up over a large area, thereby minimizing image distortion by reducing the charge in the region of interest. The effectiveness of these structures depends upon the area of the conductive ballast 72.

Figure 7:
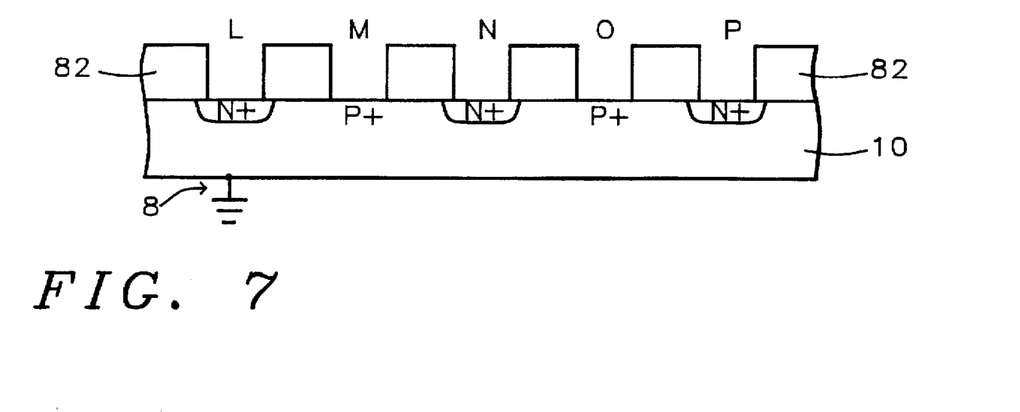
FIG. 7 is a cross section of the fourth embodiment of this invention.
Figure 8A:
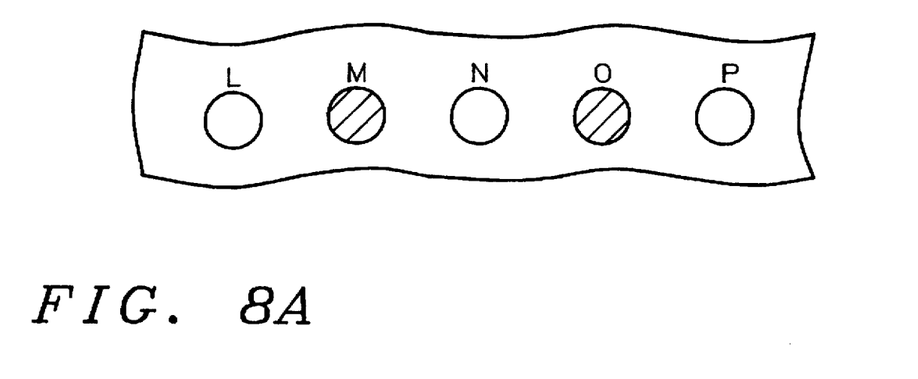
FIGS. 8A and 8B are representations of SEM views of the fourth embodiment of this invention.
Figure 8B:
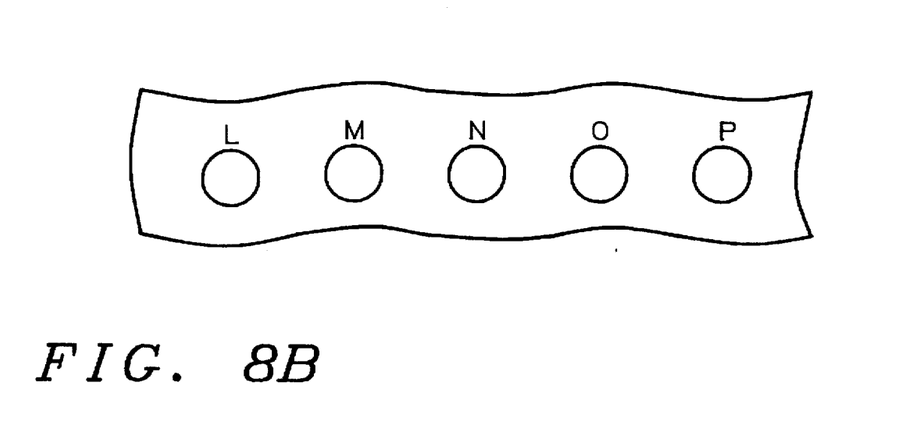

A fourth embodiment of this invention is illustrated by FIG. 7 and 8. In FIG. 7 there is shown a cross section of a test structure having a plurality of contact openings designated by L, M, N, O, and P. The substrate 10 is p-type and is grounded to the SEM at the connection 8. Alternate openings L, N, and P are formed over n+ regions in the substrate, while the openings M and O are formed over p+ regions. The contact openings are formed in the insulative layer 82 by reactive-ion-etching. If the contact openings are properly exposed by the RIE, charging occurs in openings L, N, and P because the p-n junction prevents electron flow to ground. The exposed silicon surfaces in openings M and O, however, are grounded through the p+ region and therefore do not become charged. The appearance of this test structure with properly opened contacts is shown in FIG. 8A. The alternating shades along the row of contacts can be easily recognized and interpreted. Residual insulating layer within the contact openings will not allow proper electron discharge and the row of contacts appear with equal shades as shown in FIG. 8B. Partially open contacts display slight but easily discernable variations in tone.

Whereas the fourth embodiment is a test structure designed to examine contact openings for completeness of insulator etching, a fifth embodiment is next described which utilizes the same principle as the fourth embodiment to inspect contact openings having a metal silicide layer over the silicon at their base. Such contacts are encountered in integrated circuits utilizing the self-aligned silicide(Salicide) process. See for example Wolf, S.,"Silicon Processing for the VLSI Era", Vol.2, Lattice Press, Sunset Beach, Calif., Vol.3 (1990),p144ff. The test structure is shown in cross section in FIG. 9. The silicide layer 84, frequently $TiSi_2$, is formed over the silicon surface by depositing the metal and annealing to form the silicide. The insulative layer 82 has the contact openings designated by L, M, N, O, and P. The substrate 10 is p-type and is grounded to the SEM at the connection 8. Alternate openings L, N, and P are formed over n+ regions in the substrate, while the openings M and O are formed over p+ regions. The contact openings are formed in the insulative layer 82 by reactive-ion-etching.

Figure 10A:
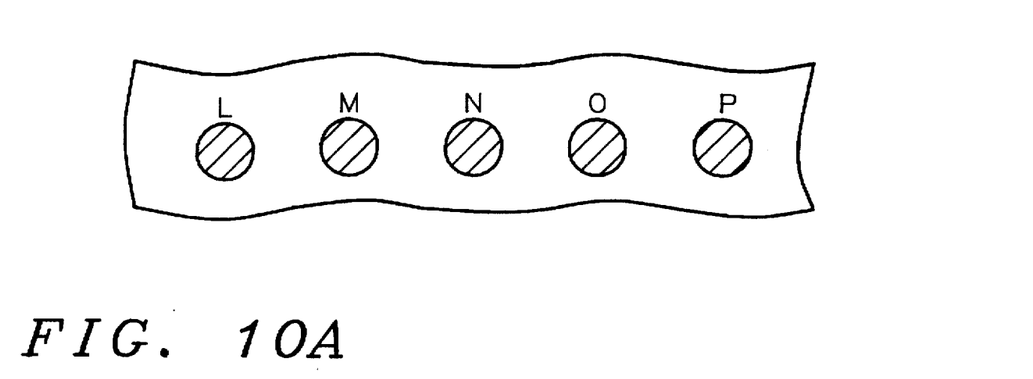
FIGS. 10A and 10B are representations of SEM views of the fifth embodiment of this invention.
Figure 10B:
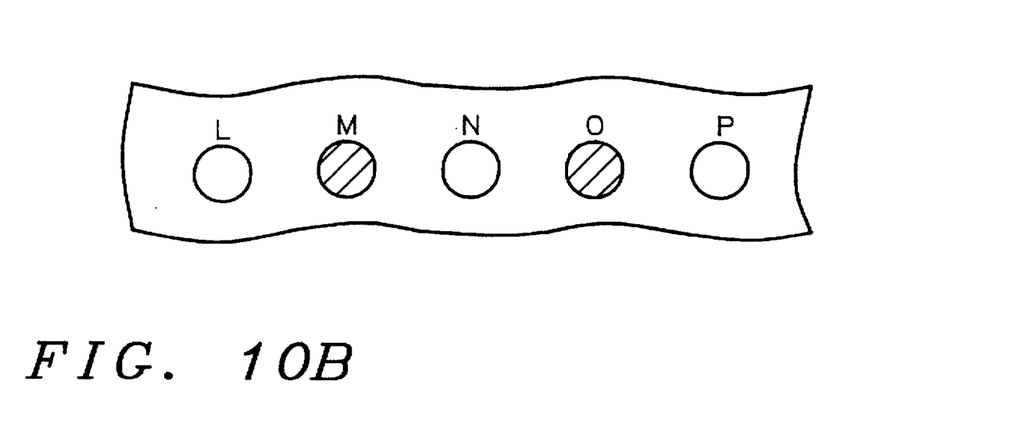

When examined in the SEM, all the openings appear of equal shade if the etching step terminated within the silicide layer 84 as illustrated by FIG. 10A. This layer 84 is grounded through contact with the p+ regions and through the substrate contact 8. If the silicide layer has been penetrated by the etchant, differences in contrast are observed between the n+ and p+ contact openings as illustrated by FIG. 10B. Partially penetrated silicide layers display slight but easily discernable variations in tone.

Figure 9:
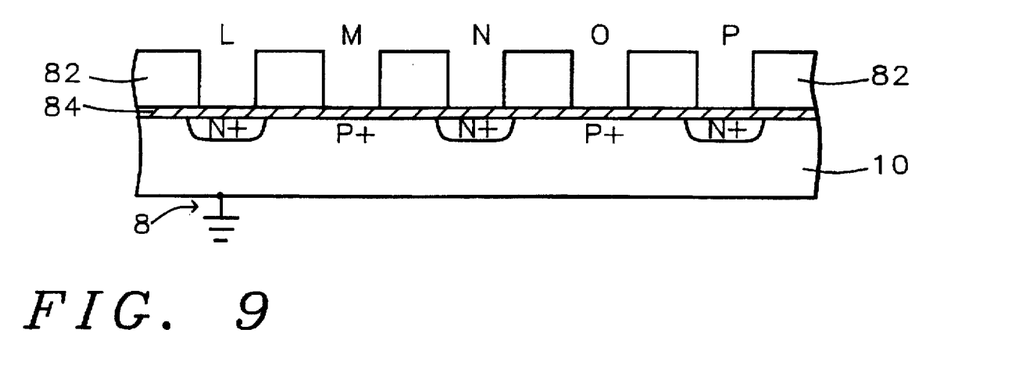
FIG. 9 is a cross section of the fifth embodiment of this invention.

By using a string of contacts with alternating n– and p– regions as illustrated for the fourth and fifth embodiments by FIGS. 7 and 9, even slight differences in SEM charging can easily be resolved.

While this invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided.

It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for inspecting and measuring an opening in an insulative layer using a grounded SEM inspection and measurement device comprising:

providing a silicon substrate having a grounded SEM inspection and measurement device comprising:
(i) an insulative layer over said silicon substrate;
(ii) an opening in said first insulative layer exposing a portion of said silicon substrate; and
(iii) a contact area on the back side of said silicon substrate whereby a continuous ohmic conductive path is provided entirely within said silicon substrate between said portion and said contact area;

placing said silicon substrate into the chamber of an SEM;
connecting said contact area to an electrical ground of said SEM; evacuating said chamber; and
operating said SEM thereby inspecting and measuring said opening.

2. The method of claim 1 wherein said opening is dimensionally equivalent to corresponding openings in integrated circuit dice located elsewhere on said silicon substrate.

3. The method of claim 1 wherein said opening is a contact opening.

4. A method for inspecting and measuring a conductive element over an insulative layer using a SEM inspection and measurement device comprising:

providing a substrate having a SEM inspection and measurement device comprising:
(i) an insulative layer;
(ii) a conductive pattern over said insulative layer, said conductive pattern having a first portion with dimensions corresponding to those of said conductive element and a second portion attached to said first portion constituting a ballast for the accumulation of charge; and
(iv) a contact area on the backside of said silicon substrate whereto an ohmic contact can be made to the electrical ground of an SEM;

placing said substrate into the chamber of an SEM;

evacuating said chamber; and
operating said SEM thereby inspecting and measuring said conductive element.

5. The method of claim 4 wherein said conductive element is dimensionally equivalent to a conductive element in integrated circuit dice located elsewhere on said substrate.

6. The method of claim 5 wherein said second portion is between about 10 to 100 times larger in area than said first portion.

7. A method for inspecting contact openings in an insulative layer for quality and completeness of RIE using an SEM comprising: providing a silicon substrate having a SEM inspection and measurement device comprising:
(i) an insulative layer;
(ii) a plurality of openings in said insulative layer, said openings exposing regions of said silicon substrate and located in such proximity that at least two adjacent openings may be observed in a single SEM view during inspection;
(iii) zones of impurity doping in said silicon substrate subjacent to said openings such that said zones in adjacent openings are of opposite conductivity type; and
(iv) a contact area on the back side of said silicon substrate whereby a continuous ohmic conductive path is provided entirely within said silicon substrate from said contact area to said zones which are of the same conductivity type as said silicon substrate;

placing said substrate into the chamber of an SEM;
evacuating said chamber; and
operating said SEM thereby inspecting said device.

8. The method of claim 7 wherein said openings are equivalent in design and dimension to contact openings in integrated circuit dice located elsewhere on said silicon substrate.

9. A method for inspecting contact openings in an insulative layer for etch penetration of a silicide layer using an SEM comprising:

providing a silicon substrate having a SEM inspection and measurement device comprising:
(i) a metal silicide layer over said silicon substrate;
(ii) an insulative layer over said metal silicide layer;
(iii) a plurality of openings in said insulative layer, said openings exposing regions of said silicon substrate exposing regions of said metal silicide layer and located in such proximity that at least two adjacent openings may be observed in a single SEM view during inspection;
(iv) zones of impurity doping in said silicon substrate subjacent to said openings such that said zones in adjacent openings are of opposite conductivity type; and
(v) a contact area on the back side of said silicon substrate whereby a continuous ohmic conductive path is provided entirely within said silicon substrate from said contact area to said zones which are of the same conductivity type as said silicon substrate;

placing said substrate into the chamber of an SEM;
evacuating said chamber; and
operating said SEM thereby inspecting said device for silicide penetration.

10. The method of claim 9 wherein said openings are equivalent in design and dimension to contact openings in integrated circuit dice located elsewhere on said silicon substrate.

* * * * *